(12) United States Patent
Shirogane et al.

(10) Patent No.: US 7,482,745 B2
(45) Date of Patent: Jan. 27, 2009

(54) LUMINESCENCE DISPLAY PANEL DISPLAYING A PREDETERMINED PATTERN

(75) Inventors: Hiroyuki Shirogane, Tokyo-To (JP);
Shinichi Handa, Tokyo-To (JP);
Kenichi Kuba, Tokyo-To (JP); Masaru Kobayashi, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 431 days.

(21) Appl. No.: 11/241,960

(22) Filed: Oct. 4, 2005

(65) Prior Publication Data
US 2006/0091796 A1 May 4, 2006

(30) Foreign Application Priority Data
Oct. 7, 2004 (JP) ............................. 2004-295174

(51) Int. Cl.
*H01J 1/62* (2006.01)
*H01J 63/04* (2006.01)
(52) U.S. Cl. .................... 313/506; 313/498; 313/504; 313/509; 313/510; 313/511
(58) Field of Classification Search .......... 313/498–512
See application file for complete search history.

(56) References Cited

U.S. PATENT DOCUMENTS 5,902,688 A 5/1999 Antoniadis et al.
6,924,594 B2* 8/2005 Ogura et al. ................. 313/506
2004/0066137 A1* 4/2004 Hayashi ....................... 313/506
2004/0119403 A1* 6/2004 McCormick et al. ........ 313/506
2004/0135503 A1* 7/2004 Handa et al. ................ 313/511
2004/0247949 A1* 12/2004 Akedo et al. ................ 428/704

FOREIGN PATENT DOCUMENTS

| WO | WO 03/075616 A1 | 9/2003 |
| WO | WO 2005/015960 A2 | 2/2005 |
| WO | WO 2005/106573 A1 | 11/2005 |

* cited by examiner

*Primary Examiner*—Toan Ton
*Assistant Examiner*—Kevin Quarterman
(74) *Attorney, Agent, or Firm*—Oliff & Berridge, PLC (57) ABSTRACT

A luminescence display panel 20 includes: a flexible transparent substrate 1; a transparent electrode 3 formed on the transparent substrate 1, over a luminescence region and a non-luminescence region; and auxiliary electrodes 5a and 5b formed on the transparent electrode 3, over the non-luminescence region. Electric insulation layers 7a, 7c, and 7d are formed over the non-luminescence region of the transparent electrode 3, so as to cover the auxiliary electrodes 5a and 5b. An organic luminescence part 9 is formed on the transparent electrode, at least over the luminescence region. A rear electrode 11 is formed on the organic luminescence part 9.

10 Claims, 3 Drawing Sheets

LUMINESCENCE DISPLAY PANEL DISPLAYING A PREDETERMINED PATTERN

BACKGROUND OF THE INVENTION

1. Field of the Invention

The present invention relates to a luminescence display panel for displaying a pattern such as a character, figure, sign, design, or static image, by combining a luminescence region and non-luminescence region. More particularly, it pertains to a luminescence display panel which can be used as an electric decorative illumination panel or the like.

2. Background Art

Recently, an organic electroluminescence device (hereinafter abbreviated as "organic EL device") known as a kind of the electroluminescence device has been put into practical use as a picture element for a flat panel display of high flexibility, or as a paper-like surface light source. As disclosed in Japanese Patent Laid-Open Publication No. 2004-111158 (see, claims, sections [0006] to [0008], and FIGS. 4 and 5), a paper-like luminescence display panel has been developed. In this luminescence display panel, a non-luminescence region of a predetermined pattern, that is, a region which does not emit light when the organic EL device is electrified, is formed in an organic EL device of a larger planar dimension. A character, figure, or sign for advertisement is displayed in the panel by a combination of a luminescence region, which emits light when the organic EL device is electrified, and the non-luminescence region.

An organic EL device is a layered body basically made by layering, on a substrate, a transparent electrode, an organic luminescence part, and a rear electrode, in this order. Out of these transparent electrode and the rear electrode, the electrode from which side electroluminescence light is extracted is formed of a transparent electrode material.

When a paper-like organic EL device is manufactured, a transparent resin film is generally used as the substrate. Although an electric conductivity of the transparent electrode is relatively low, a high electric voltage tends to be applied to the transparent electrode especially in an organic EL device of a larger planar dimension. When a high voltage is applied to the transparent electrode, there is concern that the heat generated by the flowing electricity may cause a deterioration in the organic luminescence part, a deformation in the transparent resin film serving as the substrate, or a burning of the transparent resin film.

In order to avoid these problems, a luminescence device described in Japanese Patent Laid-Open Publication No. 2003-133080 (see, claims and FIG. 2) includes a plurality of metallic bus line electrodes which are disposed with a predetermined gap therebetween on a transparent electrode, so that a heat generation can be restrained when light is emitted from the device.

As disclosed in the above Japanese Patent Laid-Open Publication No. 2003-133080, a plurality of metallic bus line electrodes disposed on a transparent electrode are helpful in restraining a heat generation when light is emitted from an organic EL device. However, a light reflectance of the metallic bus line electrode is relatively high.

Thus, when a metallic bus line electrode is disposed in a luminescence region, as in the luminescence device described in the Japanese Patent Laid-Open Publication No. 2003-133080, external light reflected on the metallic bus line electrode tends to be noticeable. In a luminescence display panel for displaying a pattern for advertisement, such as a character, figure, or sign, which kind of panel is described in Japanese Patent Laid-Open Publication No. 2004-111158, reflection of external light by a metallic bus line electrode deteriorates the image quality and thus the attractive visual effect of the panel. Therefore, reflection of external light is desired to be prevented as much as possible.

Naturally, by narrowing a line-width of the metallic bus line electrode, it is possible to prevent external light reflected on the metallic bus line electrode from being observed. However, the narrower the line-width of the metallic bus line electrode is, the higher the electric resistance of the metallic bus line electrode becomes, which makes it difficult to restrain heat generation when light is emitted from an organic EL device.

SUMMARY OF THE INVENTION

The present invention has been made in the foregoing context. An object of the present invention is to provide a luminescence display panel that is capable of displaying a predetermined pattern of a good image quality, the pattern being formed by a combination of a luminescence region and a non-luminescence region.

The present invention is a luminescence display panel for displaying a predetermined pattern formed by a luminescence region and a non-luminescence region, comprising: a flexible transparent substrate; a transparent electrode formed on the transparent substrate, over the luminescence region and the non-luminescence region; an auxiliary electrode formed on the transparent electrode, over the non-luminescence region; an electrical insulation layer formed on the transparent electrode, over the non-luminescence region; an organic luminescence part formed on the transparent electrode, at least over the luminescence region; and a rear electrode formed on the organic luminescence part; wherein the auxiliary electrode is covered with the electrical insulation layer.

(Hereinafter, the luminescence display panel is sometimes referred to as "luminescence display panel I".)

The phrase "displaying a predetermined pattern formed by a luminescence region and a non-luminescence region" herein means to display a pattern for advertisement, decorative illumination, and ornamentation, such as a character, figure, sign, design, or static image, by means of a combination of one or more luminescence region(s) of a size that can be visually observed, and one or more non-luminescence region(s) adjacent to the luminescence region(s) (a size of the non-luminescence region may be either visually observable or not).

In the luminescence display panel I according to the present invention, an organic EL device is constituted by a transparent electrode, an organic luminescence part, and a rear electrode. Due to the flexible transparent substrate, a highly flexible display panel utilizing an organic EL device can be easily obtained. In addition, at least one auxiliary electrode is formed on the transparent electrode. Since there is disposed on the transparent electrode at least one auxiliary electrode of a desired shape, which is formed of a metal or alloy having a higher conductivity than that of the transparent electrode, it is possible to increase a conductivity of an electrode formed by the auxiliary electrode and the transparent electrode. As a result, heat generation when the organic EL device emits light can be restrained. Since the auxiliary electrode is not distributed in the luminescence region, deterioration in image quality, which may be caused by a reflection of external light on the auxiliary electrode, can be easily inhibited.

Therefore, according to the present invention, there can be easily provided the luminescence display panel I which is capable of displaying a predetermined pattern of a good image quality, by combining the luminescence region and the non-luminescence region.

In the luminescence display panel I according to the present invention, (1) a gas barrier layer is preferably interposed between the transparent substrate and the transparent electrode (hereinafter, the luminescence display panel is sometimes referred to as "luminescence display panel II").

In the luminescence display panel II, oxygen and moisture is prevented from transmitting the transparent substrate to invade the organic luminescence part. Thus, deterioration in the organic luminescence part can be restricted, so that a life duration of the luminescence display panel II can be easily elongated.

Both in the luminescence display panels I and II, (2) a sealing layer is preferably formed to cover an exposed surface of the rear electrode and an exposed surface of an organic luminescence part (hereinafter, the luminescence display panel is sometimes referred to as "luminescence display panel III").

In the luminescence display panel III, oxygen and moisture is prevented from transmitting the transparent substrate to invade the organic luminescence part, and oxygen and moisture is prevented from invading the organic luminescence part through side surfaces thereof. Thus, deterioration in the organic luminescence part can be restricted, so that a life duration of the luminescence display panel III can be easily elongated.

The present invention is a luminescence display panel, wherein the predetermined pattern is formed of a plurality of pattern elements defining parts of the luminescence region, and the auxiliary electrode is disposed to surround a pattern line including some of the pattern elements.

The present invention is a luminescence display panel, wherein the auxiliary electrode is further disposed between the pattern elements.

The present invention is a luminescence display panel, wherein the predetermined pattern is formed of a plurality of pattern elements defining parts of the non-luminescence region, and the auxiliary electrode is disposed to surround a pattern line including some of the pattern elements.

The present invention is a luminescence display panel, wherein the auxiliary electrode defines an inner periphery of further parts of the non-luminescence region surrounding a pattern line.

The present invention is a luminescence display panel, wherein the rear electrode has a first rear electrode having a higher chemical activity, and a second rear electrode covering the first electrode and having a lower chemical activity.

The present invention is a luminescence display panel, wherein the rear electrode is formed of a transparent electrode.

The present invention is a luminescence display panel, wherein the sealing layer is of a layered body including a substrate layer, a gas barrier layer for sealing, and an adhesive layer, which are disposed in this order from outside.

As described above, the present invention makes it possible to display a pattern such as a character, figure, sign, design, or static image, of a good image quality, by a combination of a luminescence region and non-luminescence region. Thus, the present invention can provide a luminescence display panel suitable for various uses such as a luminescence display panel for advertisement with an attractive visual effect, a luminescence display panel for electric decorative illuminations with an attractive visual effect, and an ornamental luminescence display panel of a high quality.

DETAILED DESCRIPTION OF THE INVENTION

Embodiments of the present invention will be described hereinbelow with reference to the drawings.

First Embodiment

Figure 1:
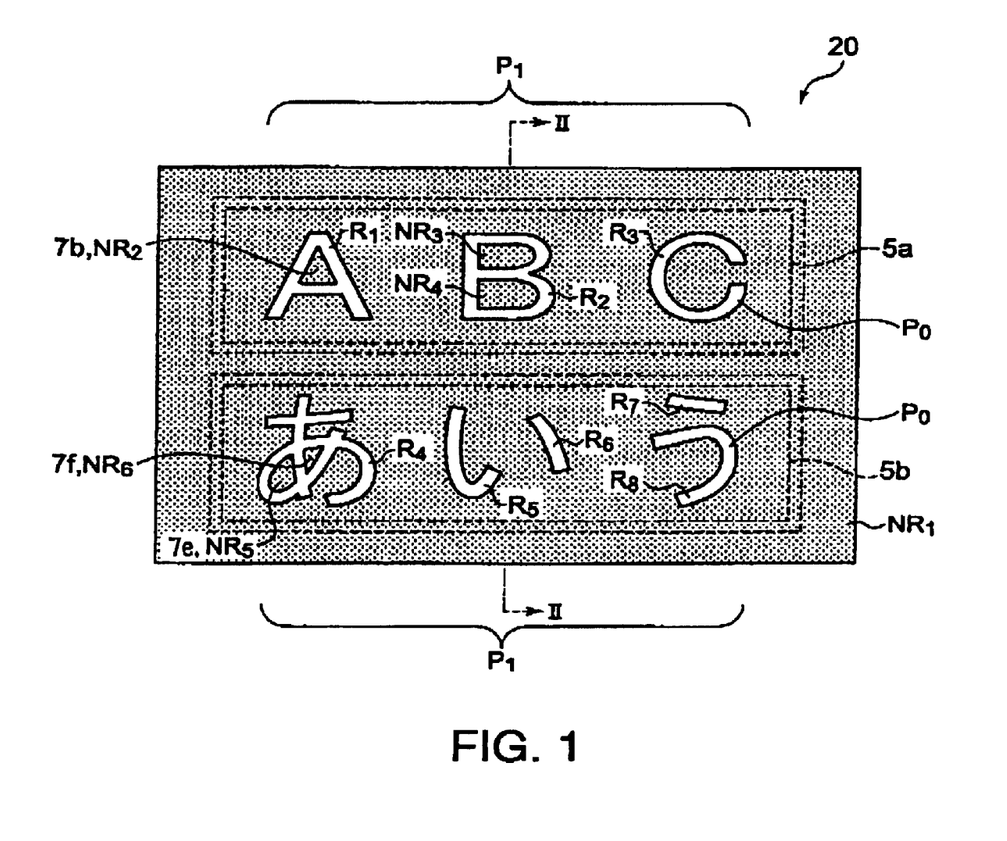
FIG. 1 is a schematic front view of a display surface of an example of a luminescence display panel according to the present invention.

FIG. 1 is a schematic front view of a display surface of an example of a luminescence display panel according to the present invention.

As described above, a luminescence display panel according to the present invention displays a predetermined pattern (a character, figure, sign, design, static image, and so on) formed by a luminescence region and a non-luminescence region. As shown in FIG. 1, a luminescence display panel 20 displays thereon a character line of "ABC" in an upper half part and a character lie of "あいう" (Japanese) in a lower half part, by a combination of eight luminescence regions $R_1$ to $R_8$ and six non-luminescence regions $NR_1$ to $NR_6$.

In FIG. 1, the predetermined pattern of "ABC" "あいう" are shown. A character line (pattern line) $P_1$, i.e., "ABC" is constituted by three characters (pattern elements) $P_0$, i.e., "A", "B", and "C".

In FIG. 1, the respective non-luminescence regions $NR_1$ to $NR_6$ are smudged in order to facilitate a differentiation from the luminescence regions $R_1$ to $R_8$. The reference numbers 5a and 5b in FIG. 1 respectively depict auxiliary electrodes which will be described below.

Figure 2:
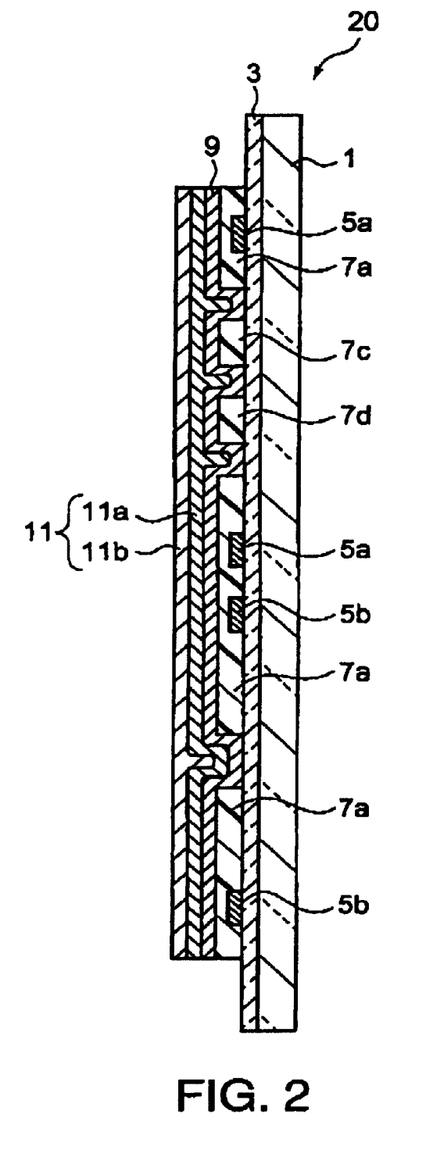
FIG. 2 is a schematic view of an example of a basic sectional structure of the luminescence display panel according to the present invention, when taken along the line II-II shown in FIG. 1.

FIG. 2 is a schematic view of an example of a basic sectional structure of the luminescence display panel according to the present invention, when taken along the line II-II of the luminescence display panel 20 shown in FIG. 1. As shown in FIG. 2, the luminescence display panel 20 includes: a flexible transparent substrate 1; one transparent electrode 3 formed on the transparent substrate 1; two auxiliary electrodes 5a and 5b, and six electric insulation layers 7a to 7f, all of which are formed on the transparent electrode 3 (only three electric insulation layers 7a, 7c, and 7d are shown in FIG. 2); one organic luminescence part 9 formed on the respective electric insulation layers 7a to 7f and parts of the transparent electrode 3, the parts not being covered with the electric insulation layers 7a to 7f but being exposed; and one rear electrode 11 formed on the organic luminescence part 9.

A transparent resin film or a transparent glass sheet may be used as the transparent substrate 1. A transparent resin film is preferably made of a fluorine-based resin, polyethylene, polypropylene, polyvinyl chloride, polyvinyl fluoride, polystyrene, an ABS resin, polyamide, polyacetal, polyester, polycarbonate, modified polyphenylene ether, polysulfone, polyarylate, polyether imide, polyamide imide, polyimide, polyphenylene sulfide, liquid crystalline polyester, polyethylene terephthalate, polybutylene terephthalate, polyethylene naphthalate, polyoxymethylene, polyether sulfone, polyether ether ketone, polyacrylate, an acrylonitrile-styrene resin, a phenol resin, an urea resin, a melamine resin, an unsaturated polyester resin, an epoxy resin, polyurethane, a silicone resin, or amorphous polyolefin. A transparent resin film having a film-thickness of less than about 50 μm may easily invite a deformation of the luminescence display panel 20 during a manufacture thereof. An upper limit value of a film-thickness of a transparent resin film can be suitably selected depending on an application of a desired luminescence display panel, and a flexibility required for the luminescence display panel.

It is desired that the transparent resin film has a higher solvent resistance, heating resistance, light resistance, and gas barrier property (a barrier property against water vapor and oxygen (the term is used for this meaning below)). As to the gas barrier property of the transparent resin film, the gas barrier property can be improved by disposing additionally a gas barrier layer described hereinafter (see, Second Embodiment).

On the other hand, when a transparent glass sheet is used as the transparent substrate 1, a thickness of the transparent glass sheet is preferably equal to or less than about 100 μm. If needed, a protective plastic layer for mechanically protecting the transparent glass sheet may be additionally disposed. The protective plastic layer preferably also functions as a gas barrier layer.

The transparent electrode 3 used as an anode of an organic EL device is formed on the transparent substrate, over both the luminescence regions $R_1$ to $R_8$ and the non-luminescence regions $NR_1$ to $NR_6$ (see, FIG. 1). The transparent electrode 3 may be made of: an inorganic transparent conductive oxide such as indium tin oxide (ITO), indium oxide, and indium zinc oxide (IZO); or an organic conductive material such as polyaniline. Especially, ITO and IZO are preferred. A film-thickness of the transparent electrode 3 can be suitably selected in a range of from about 0.005 μm to about 0.5 μm.

From the standpoint of preventing a deformation of the transparent substrate 1 by reducing a residual stress in the transparent substrate 1 as much as possible, the stress being caused during a formation of the transparent electrode 3, the transparent electrode 3 is preferably formed by a vacuum deposition method, an ion plating method, or a printing method. When the transparent electrode 3 is formed by a printing method, a conductive ink or a conductive paste is applied to the transparent substrate 1 to form a coating film of a predetermined shape by a screen printing, a flexographic printing, an offset printing, or the like. Thereafter, the coating film is subjected to a heat treatment to form the transparent electrode 3.

The auxiliary electrodes 5a and 5b cooperate with the transparent electrode 3 to form a highly conductive electrode. In the luminescence display panel 20, there are disposed on the transparent electrode 3 the auxiliary electrode 5a of a rectangular frame which surrounds the character line $P_1$ "ABC" (see, FIG. 1) when viewed from the front, and the auxiliary electrode 5b of a rectangular frame which surrounds the character line $P_1$ "あいう" (see, FIG. 1) when viewed from the front.

Each of the auxiliary electrodes 5a and 5b is formed of an alloy material having a conductivity higher than a material of the transparent electrode 3, or a metal material such as silver (Ag), gold (Au), aluminum (Al), and copper (Cu). A film-thickness and a line-width of each of the auxiliary electrodes 5a and 5b can be suitably selected depending on an electric property of the transparent electrode 3, a size of the transparent electrode 3, and a material of the auxiliary electrodes 5a and 5b, such that a volume resistance of the auxiliary electrodes 5a and 5b in conjunction with the transparent electrode 3 is in a range of from about $1 \times 10^{-6}$ Ω·cm to about $1 \times 10^{-4}$ Ω·cm. Note that, when deciding a film-thickness of each of the auxiliary electrodes 5a and 5b, a film-thickness of the electric insulation layer 7a, which is described below, must be taken into consideration, such that the electric insulation layer 7a entirely covers each of the auxiliary electrodes 5a and 5b.

From the standpoint of preventing a deformation of the transparent substrate 1 by reducing a residual stress in the transparent substrate 1 as much as possible, the stress being caused during a formation of the auxiliary electrodes 5a and 5b, the auxiliary electrodes 5a and 5b are preferably formed by a vacuum deposition method with a use of a deposition mask of a predetermined shape, an ion plating method with a use of a deposition mask of a predetermined shape, or a printing method. When the auxiliary electrodes 5a and 5b are formed by a printing method, a conductive ink or a conductive paste is applied to the transparent electrode 3 to form a coating film of a predetermined shape by a screen printing, a flexographic printing, an offset printing, or the like. Thereafter, the coating film is subjected to a heat treatment to form the auxiliary electrodes 5a and 5b.

The electric insulation layers 7a to 7f locally insulate the transparent electrode 3 and the rear electrode 11 from each other, such that only the luminescence regions $R_1$ to $R_8$ (see, FIG. 1) of the organic luminescence part 9 emit light. The electric insulation layers 7a to 7f are formed on the transparent electrode 3 over the non-luminescence regions $NR_1$ to $NR_6$, while covering the auxiliary electrodes 5a and 5b. The electric insulation layer 7a corresponds to the non-luminescence region $NR_1$, the electric insulation layer 7b corresponds to the non-luminescence region $NR_2$, the electric insulation layer 7c corresponds to the non-luminescence region $NR_3$, the electric insulation layer 7d corresponds to the non-luminescence region $NR_4$, the electric insulation layer 7e corresponds to the non-luminescence region $NR_5$, and the electric insulation layer 7f corresponds to the non-luminescence region $NR_6$.

Each of the electric insulation layers 7a to 7f is obtained by applying a photo-curing resin composition (including an ultraviolet curing resin composition) or an electron beam curing resin composition to form a coating film, and then patterning the coating film into a predetermined shape by a photo-lithography method or an electron-beam lithography method. A film-thickness of each of the electric insulation layers 7a to 7f can be suitably selected in a range of from about 0.5 μm to about 7.0 μm depending on a material of the electric insulation layers 7a to 7f and a driving voltage of the luminescence display panel 20, such that the electric insulation layers 7a to 7f locally insulate the transparent electrode 3 from the rear electrode 11, and insulate the auxiliary electrodes 5a and 5b from the rear electrode 11.

In order to prevent the luminescence display panel 20 from being deformed when it is being manufactured, it is preferable that a thermal expansion coefficient of the transparent substrate 1 and a thermal expansion coefficient of each of the electric insulation layers 7a to 7f are similar to each other as closely as possible.

The organic luminescence part 9, together with the transparent 3 and the rear electrode 11, constitutes an organic EL device. The organic luminescence part 9 is formed at least over the luminescence regions $R_1$ to $R_8$ (see, FIG. 1) of the transparent electrode 3. In the luminescence display panel 20, the organic luminescence part 9 is formed on surfaces of the electric insulation layers 7a to 7f, and parts of the transparent electrode 3 which are not covered with the electric insulation layers 7a to 7f but are exposed.

The organic luminescence part 9 may be: (1) a single layer structure formed only of an organic luminescent material; (2) a two-layer structure including a hole transport layer formed of a hole transport material and an organic luminescent material layer formed of an organic luminescent material, the layers being laid in this order from a side of the transparent electrode 3; (3) a two-layer structure including an organic luminescent material layer formed of an organic luminescent material and an electron transport layer formed of an electron transport material, the layers being laid in this order from a side of the transparent electrode 3; or (4) a three-layer structure including a hole transport layer, an organic luminescent material layer, and an electron transport layer, the layers being laid in this order from a side of the transparent electrode 3.

Alternatively, the organic luminescence part 9 may be: (5) a two-layer structure including a hole transport layer and an organic luminescent material layer also serving as an electron transport layer, the layers being laid in this order from a side of the transparent electrode 3; (6) a two-layer structure including an organic luminescent material layer also serving as a hole transport layer, and an electron transport layer, the layers being laid in this order from a side of the transparent electrode 3; or (7) a single layer structure including only an organic mixture layer serving as an organic luminescent material layer and at least one of a hole transport layer and an electron transport layer.

The organic luminescent material layer, the hole transport layer, the electron transport layer, and the organic mixture layer can be respectively formed of various kinds of organic luminescent materials, hole transport materials, and electron transport materials, which are known as materials for manufacturing an organic EL device. These layers may be formed by a vacuum deposition method or a wet method, for example. In a wet method, a coating composition containing an organic luminescent material, a hole transport material, or an electron transport material is applied to form a coating film by an ink jet method, a spin coat method, a printing method, and a dispensing method for dropping the coating composition by means of a dispenser. Then, the coating film is cured or hardened by heating the same by a vacuum thermal treatment or the like, so that the organic luminescent material layer, the hole transport layer, the electron transport layer, or the organic mixture layer can be formed.

In order to display a multi-color image by the luminescence display panel 20, plural kinds of organic luminescent materials of different luminescent colors are prepared, and a plurality of organic luminescent material layers of different luminescent colors or organic luminescence parts of different luminescent colors are formed on desired positions. At this time, it is preferable that a partition wall made of a resin material is previously disposed on the transparent electrode 3, between the organic luminescent material layers of different colors or the organic luminescence parts of different colors. The partition wall can be formed by a method such as a thick-film printing, a photo-lithography, and an electron-beam lithography.

In both cases where the luminescence display panel 20 is used as a mono-color display panel and a multi-color display panel, a film-thickness of the organic luminescence part 9 on the luminescence regions $R_1$ to $R_8$ is preferably selected in a range of from about 0.1 μm to about 2.5 μm, from the standpoint of forming an organic EL device having a high brightness as well as preventing a short-circuit between the transparent electrode 3 and the rear electrode 11.

The rear electrode 11 formed on the organic luminescence part 9 is used as a cathode of the organic EL device. In order to obtain a rear electrode suitable to serve as a cathode of the organic EL device, the rear electrode 11 is formed of metals or alloys having a small work function, e.g., an alkali metal, an alkaline-earth metal, an alloy containing an alkali metal, and an alloy containing an alkaline-earth metal. Although the rear electrode 11 may be a single layer structure, the rear electrode 11 is preferably a layered structure as shown in FIG. 2, because of a high chemical activity of an alkali metal or an alloy thereof, or a high chemical activity of an alkaline-earth metal or an alloy thereof. The rear electrode 11 preferably includes: a first rear electrode 11a formed of an alkali metal or an alloy thereof, or an alkaline-earth metal or an alloy thereof; and a second rear electrode 11b formed of a conductive material having a low chemical activity, such as silver (Ag), gold (Au), and aluminum (Al). The first rear electrode 11a is protected by the second rear electrode 11b.

When the rear electrode 11 (or the second rear electrode 11b) is formed by a transparent electrode material, light emitted from the luminescence regions $R_1$ to $R_8$ can be observed from both a side of the transparent substrate 1 and a side of the rear electrode 11. In other words, it is possible to observe the character lines $P_1$ "ABC" and "あいう" and an mirror image of the character lines $P_1$ displayed on the luminescence display panel 20, from both sides of the transparent substrate 1 and the rear electrode 11.

The rear electrode 11, irrespective of a single layer structure and a layered structure, can be formed either only over the luminescence regions R1 to R8, or over the luminescence regions $R_1$ to $R_8$ and the non-luminescence regions $NR_1$ to $NR_6$. A film-thickness of the rear electrode 11 can be suitably selected in a range of from about 0.005 μm to about 1 μm. When the rear electrode 11 is of a layered structure, a film-thickness of each of the first rear electrode 11a and the second rear electrode 11b is preferably, suitably selected in a range of from 0.005 μm to 0.5 μm. The rear electrode 11 can be formed by a vacuum deposition method, for example.

In the luminescence display panel 20 having a constitution as described above, the transparent electrode 3, the organic luminescence part 9, and the rear electrode 11 constitute the organic EL device. Since the transparent substrate 1 is flexible, a highly flexible display panel using the organic EL device can be easily obtained. In the luminescence display panel 20, since the auxiliary electrodes 5a and 5b are formed on the transparent electrode 3, it is possible to increase a conductivity of an electrode formed by the auxiliary electrodes 5a and 5b and the transparent electrode 3. As a result, heat generation when the organic EL device emits light can be restrained. Since the auxiliary electrodes 5a and 5b are not distributed in an inside of each of the characters to be displayed, that is, "A", "B", "C", "あ", "い", and "う" (inside the luminescence regions $R_1$ to $R_8$), deterioration in image quality, which may be caused by a reflection of external light on the auxiliary electrodes 5a and 5b, can be easily avoided.

Accordingly, by combining the luminescence regions $R_1$ to $R_8$ and the non-luminescence regions $NR_1$ to $NR_6$, the luminescence display panel 20 can easily display the above characters with a high image quality.

By suitably changing a combination of a luminescence region and a non-luminescence region so as to display a desired pattern such as a character, figure, sign, design, or static image, there can be provided a luminescence display panel suitable for various uses such as a luminescence display panel for advertisement with an attractive visual effect, a luminescence display panel for electric decorative illuminations with an attractive visual effect, and an ornamental luminescence display panel of a high quality.

Second Embodiment

Since properties of an organic luminescent material used in an organic EL device are deteriorated by oxygen and moisture, the organic EL device is generally subjected to a sealing treatment for preventing an invasion of oxygen and moisture into an organic luminescence part. A luminescence display panel according to the present invention is preferably subjected to the sealing treatment.

Figure 3:
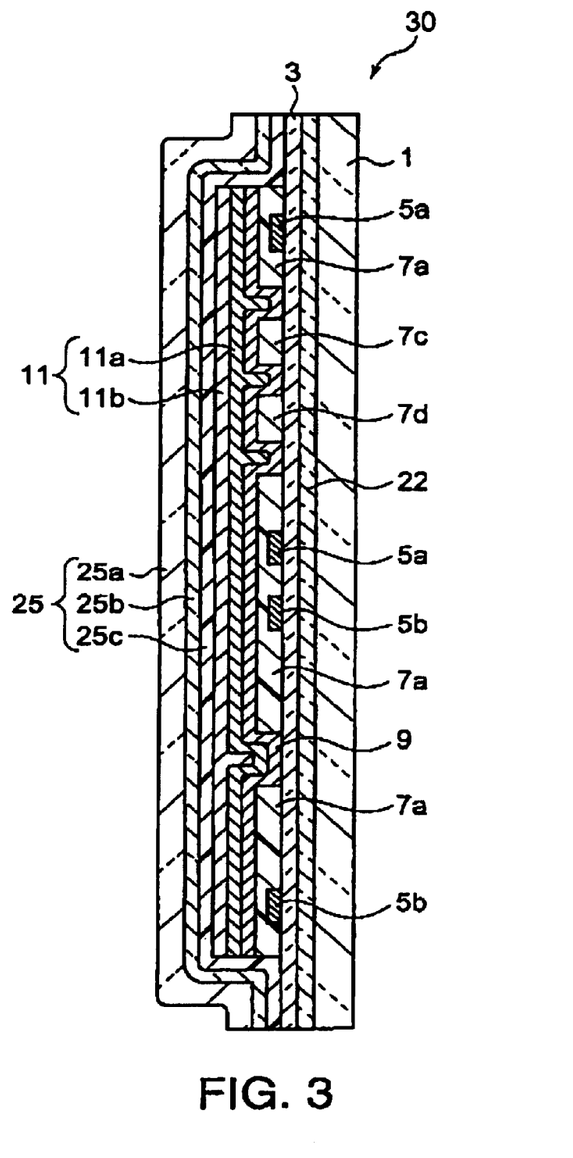
FIG. 3 is a sectional view schematically showing an example of the luminescence display panel which has been subjected to a sealing treatment.

FIG. 3 is a sectional view schematically showing an example of a luminescence display panel according to the present invention, which has been subjected to the sealing treatment. A luminescence display panel 30 shown in FIG. 3 has a constitution in which: a gas barrier layer 22 is disposed on a transparent substrate 1, which corresponds to the transparent substrate 1 of the luminescence display panel 20 shown in FIGS. 1 and 2; and a sealing layer 25 is disposed on a rear electrode 11. Except for the gas barrier layer 22 and the sealing layer 25, the constitution of the luminescence display panel 30 is the same as that of the luminescence display panel 20 shown in FIG. 2. Thus, the constituent elements shown in FIG. 3 which are common to the constituent elements shown in FIG. 2 have the same reference numbers as those in FIG. 2, and their detailed description are omitted. However, when a transparent resin film is used as the transparent substrate 1, it is preferable that a film-thickness thereof is suitably selected in a range of from about 50 μm to about 200 μm, from the standpoint of easily obtaining a highly flexible luminescence display panel 30.

The gas barrier layer 22 prevents oxygen and moisture from transmitting the transparent substrate 1 to invade the organic luminescence part 9. Although the gas barrier layer 22 can be disposed on an outer surface of the transparent substrate 1, the gas barrier layer 22 is preferably disposed on an inner surface of the transparent substrate 1 as shown in FIG. 3.

The gas barrier layer 22 may be formed of: an inorganic oxide such as silicon oxide, aluminum oxide, titan oxide, yttrium oxide, germanium oxide, zinc oxide, magnesium oxide, calcium oxide, boron oxide, strontium oxide, barium oxide, lead oxide, zirconium oxide, sodium oxide, lithium oxide, and kalium oxide; an inorganic nitride such as silicon nitride; or an oxynitride such as silicon oxynitride. Preferably, a film-thickness of the bas barrier layer 22 is suitably selected in a range of from 0.01 μm to 0.5 μm, from the standpoint of preventing an invasion of oxygen and moisture into the organic luminescence part 9, as well as obtaining a high flexibility of the luminescence display panel 30. The gas barrier layer 22 can be formed by vacuum deposition method, for example.

On the other hand, the sealing layer 25 prevents oxygen and moisture from transmitting the rear electrode 11 to invade the organic luminescence part 9, while also preventing oxygen and moisture from invading the organic luminescence part 9 through side surfaces of the same. In order thereto, the sealing layer 25 covers an exposed surface of the rear electrode 11 and an exposed surface of the organic luminescence part 9.

The sealing layer 25 may have a relatively thick single layer structure formed by curing, e.g., a solventless resin composition. However, from the standpoint of preventing oxygen and moisture from invading the organic luminescence part 9, the sealing layer 25 is preferably formed of a layered body including a flexible substrate 25a, a gas barrier layer (gas barrier layer for sealing) 25b disposed on the substrate 25a, and an adhesive layer 25c disposed on the gas barrier layer 25b, as shown in FIG. 3. In this case, the substrate 25a, the gas barrier layer 25b, and the adhesive layer 25c are arranged in this order from outside.

The substrate 25a may be either transparent or not. Meanwhile, the substrate 25a preferably has a flexibility which is equal to or more than a flexibility of the transparent substrate 1. A transparent resin film, which is given as an example of a material of the transparent substrate 1, can be used as a material of the substrate 25a. Preferably, a film-thickness of the substrate 25a is suitably selected in a range of from about 50 μm to about 300 μm.

The gas barrier layer 25b laid on the substrate 25a can be formed of the same material as that of the gas barrier layer 22 in the same manner as that of the gas barrier layer 22. The adhesive layer 25c laid on the gas barrier layer 22 adheres the sealing layer 25 to an inner peripheral part of the gas barrier layer 22, to exposed surfaces of the electric insulation layer 7a and the organic luminescence part 9, and to an outer surface of the rear electrode 11. The adhesive layer 25c is formed of an epoxy resin-based thermoset resin composition, an acryl resin-based ultraviolet curing resin composition, and so forth.

When the adhesive layer 25c is formed of a solventless thermoset resin composition, the adhesive layer 25c may be either formed over an entire upper surface of the gas barrier layer 25b, or locally formed only on a desired position of the gas barrier layer 25b. Alternatively, when the adhesive layer 25c is formed of an ultraviolet curing resin composition, the adhesive layer 25c is preferably formed in an inner peripheral part of a surface (upper surface) of the gas barrier layer 25b, such that the adhesive layer 25c is not in contact with the rear electrode 11 and the organic luminescence part 9. Irrespective of a material of the adhesive layer 25c, a thickness of the adhesive layer 25c may be suitably selected in a range of from about 1 μm to about 200 μm.

In order to prevent a deformation of the luminescence display panel 30 when it is being manufactured, it is preferable that thermal expansion coefficients of the transparent substrate 1, the electric insulation layers 7a to 7f, and the substrate 25a are close to each other as much as possible. A total film-thickness of the luminescence display panel 30 can be suitably selected in a range of equal to or less than about 1 mm, depending on an application or desired flexibility of the luminescence display panel 30.

In the luminescence display panel 30 having the above-described constitution, the gas barrier layer 22 and the sealing layer 25 can prevent oxygen and moisture from invading the organic luminescence part 9. Therefore, a luminescence display panel of a longer life duration can be easily obtained, as compared with the luminescence display panel 20 shown in FIGS. 1 and 2.

<Modification>

Not limited to a rectangular frame shape of the auxiliary electrode 5a or 5b as shown in FIG. 1, an auxiliary electrode which constitutes a luminescence display panel may have various shapes in plan view, depending on a pattern to be displayed, such as a character, figure, sign, design, or static image, and an arrangement of parts forming the pattern. That is, in addition to a rectangular frame shape, an auxiliary electrode may be formed into, e.g., a closed shape, a linear shape, a curved shape, and a planar shape.

Figure 4:
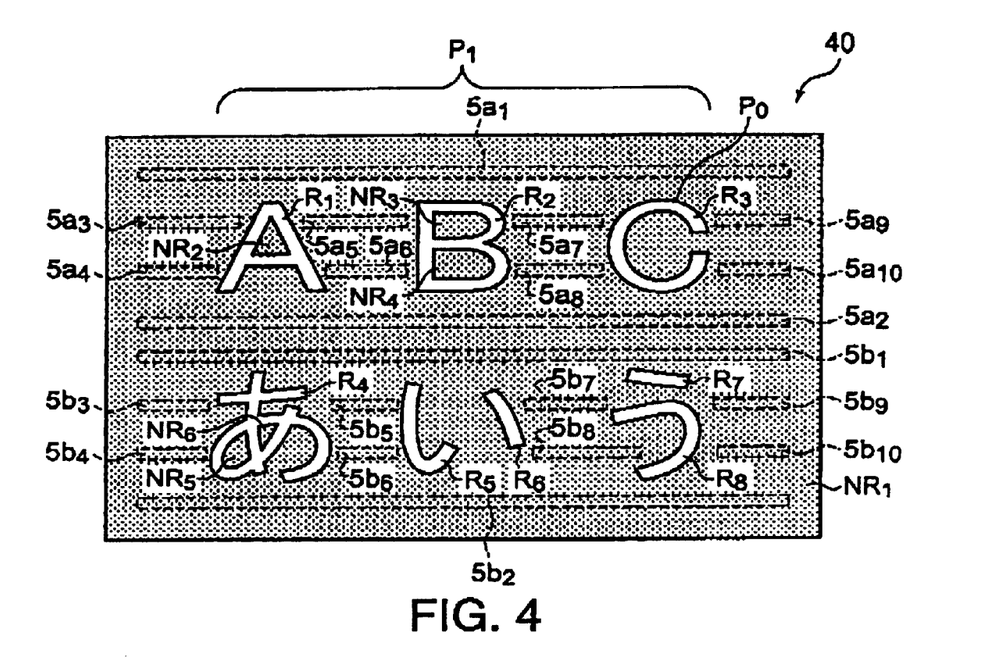
FIG. 4 is a schematic front view of a display surface of an example of the luminescence display panel according to the present invention, which has a plurality of linear auxiliary electrodes.

FIG. 4 is a schematic view of an example of a luminescence display panel including a plurality of linear auxiliary electrodes, showing a display surface when viewed from the front. Similar to the luminescence display panel 20 shown in FIG. 1, a luminescence display panel 40 shown in FIG. 4 displays thereon a character line "ABC" in an upper half part and a character line "あいう" in a lower half part. Distributions of the luminescence regions and the non-luminescence regions in the luminescence display panel 40 are the same as those in the luminescence display panel 20 shown in FIG. 1. Thus, the same reference numbers as those in FIG. 1 are given to these regions, and the non-luminescence regions are smudged.

In the luminescence display panel 40 when it is viewed from the front as shown in FIG. 4, an auxiliary electrode $5a_1$ is disposed above the character line "ABC" and an auxiliary electrode $5a_2$ is disposed below the same. Between the auxiliary electrodes $5a_1$ and $5a_2$, eight auxiliary electrodes $5a_3$ to $5a_{10}$ are arranged such that the auxiliary electrodes $5a_3$ to $5a_{10}$ do not overlap the luminescence regions $R_1$ to $R_3$. Meanwhile, an auxiliary electrode $5b_1$ is disposed above the character line "あいう" and an auxiliary electrode $5b_2$ is disposed below the same, when the luminescence display panel 40 is viewed from the front. Between the auxiliary electrodes $5b_1$ and $5b_2$, eight auxiliary electrodes $5b_3$ to $5b_{10}$ are arranged such that the auxiliary electrodes $5b_3$ to $5b_{10}$ do not overlap the luminescence regions $R_4$ to $R_8$.

By disposing the auxiliary electrodes $5a_1$ to $5a_{10}$ and the auxiliary electrodes $5b_1$ to $5b_{10}$, the same technical effect as that of the luminescence display panel 20 shown in FIG. 1 can be produced. When the characters to be displayed, i.e., "A", "B", "C", "あ", "い", and "う" are small, the auxiliary electrodes $5a_3$ to $5a_{10}$ and the auxiliary electrodes $5b_3$ to $5b_{10}$ can be omitted. Similarly, when a space between the character lines "ABC" and "あいう" is narrow, one of the auxiliary electrodes $5a_2$ and $5b_1$ or both can be omitted.

In the luminescence display panel 20 shown in FIG. 1 and the luminescence display panel 40 shown in FIG. 4, the characters to be displayed emit light. However, it is sufficient that the luminescence display panel according to the present invention displays a pattern such as a character, figure, sign, design, or static image, by a combination of a luminescence region and non-luminescence region. Thus, it is possible to constitute a luminescence display panel such that a pattern to be displayed, such as a character, figure, sign, design, or static image does not emit light, but a part surrounding the same emits light.

Figure 5:
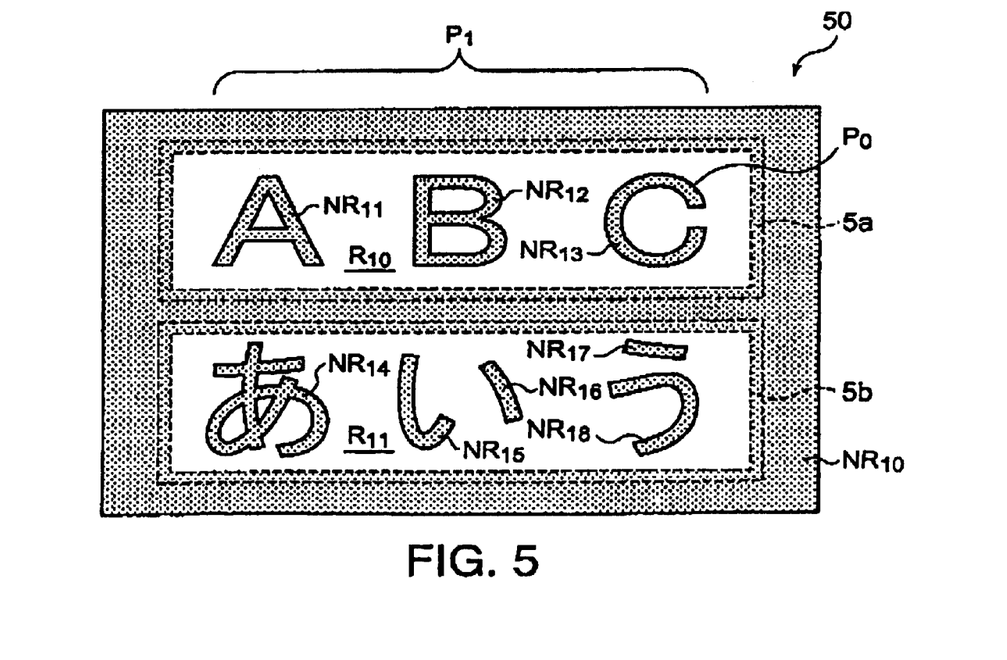
FIG. 5 is a schematic front view of a display surface of an example of the luminescence display panel in which characters to be displayed do not emit light while a region surrounding the characters emits light.

FIG. 5 is a schematic front view of a display surface of an example of a luminescence display panel in which characters to be displayed does not emit light while a region surrounding the characters emits light. Similar to the luminescence display panel 20 shown in FIG. 1, a luminescence display panel 50 shown in FIG. 5 displays thereon a character line "ABC" in an upper half part and a character line "あいう" in a lower half part.

In the luminescence display panel 50, the character line "ABC" is formed by three non-luminescence regions $NR_{11}$ to $NR_{13}$, while the character line "あいう" is formed by five non-luminescence regions $NR_{14}$ to $NR_{18}$. A luminescence region $R_{10}$ is formed around the respective non-luminescence regions $NR_{11}$ to $NR_{13}$. A luminescence region $R_1$ is formed around the respective non-luminescence regions $NR_{14}$ to $NR_{18}$. A non-luminescence region $NR_{10}$ is formed around the luminescence regions $R_{10}$ and $R_{11}$. Except that an electric insulation layer has generally a shape corresponding to the non-luminescence regions $NR_{10}$ to $NR_{18}$, the luminescence display panel 50 can be manufactured in the same manner as that of the luminescence display panel 20 shown in FIG. 1 or the luminescence display panel 30 shown in FIG. 3.

In FIG. 5, the respective non-luminescence regions $NR_{10}$ to $NR_{18}$ are smudged in order to facilitate a differentiation from the luminescence regions $R_{10}$ and $R_{11}$. The reference numbers $5a$ and $5b$ in FIG. 5 respectively depict auxiliary electrodes.

Although the luminescence display panel has been explained as above, the present invention is not limited thereto and various modifications, changes, combinations can be made in the luminescence display panel.

EXAMPLE 1

At first, a laminated resin film was prepared in which an ITO film having a film-thickness of 0.1 μm was formed on one surface of a polyether sulfone film having a film-thickness of 100 μm. In the laminated rein film, the polyether sulfone film corresponds to the "flexible transparent substrate" and the ITO film corresponds to the "transparent electrode" in the present invention.

Then, silver (Ag) was deposited on the transparent electrode by a vacuum deposition method with a use of a deposition mask of a predetermined shape, so that two auxiliary electrodes each having the same shape as that of the auxiliary electrode $5a$ or $5b$ of the luminescence display panel 20 shown in FIG. 1 were formed. The two auxiliary electrodes were arranged on the same positions as those of the auxiliary electrodes $5a$ and $5b$ in the luminescence display panel 20 shown in FIG. 1. Each of the auxiliary electrodes has a thickness of 0.2 μm, and a line-width of 1 mm.

Next, the transparent electrode with the auxiliary electrodes formed thereon was spin-coated with a photoresist to form a coating film. After the coating film was pre-baked, the coating film was selectively exposed with a use of an exposure mask of a predetermined shape. Then, the coating film was post-baked and developed so that an electrical insulation film of a predetermined pattern was formed. A film-thickness of the electric insulation film on the transparent electrode was 2 μm. The electric insulation film covered the respective auxiliary electrodes.

Subsequently, BAYTRON P (trade name) manufactured by Bayer AG was prepared to be used as a coating composition for forming a hole transport layer. The coating composition was applied to the electric insulation film and the transparent electrode by a spin-coating method to form thereon a coating film. Then, the coating film was cured by a heat treatment at 150° C., so that a hole transport layer having a film-thickness of 0.08 μm (meaning a film-thickness on the transparent electrode) was formed.

Then, a mixture of 70 parts by weight of polyvinyl carbazole, 30 parts by weight of oxydiazole, 1 parts by weight of cyanomethylene phyran derivative, and 4,900 parts by weight of monochlorobenzene were prepared to be used as a coating composition for forming an organic luminescence layer. The coating composition was applied to the hole transport layer by a spin-coating method to form thereon a coating film. Then, the coating film was cured by a heat treatment at 150° C., so that an organic luminescence layer of a film-thickness of 0.07 μm was formed. In this manner, an organic luminescence part of a two-layer structure including the hole transport layer and the organic luminescence layer was obtained.

A metal calcium (Ca) was deposited on the organic luminescence part by a vacuum deposition method, so that a calcium layer having a film-thickness of 0.008 μm was formed. Following thereto, silver (Ag) was deposited on the calcium layer by a vacuum deposition method, so that a silver layer having a film-thickness of 0.5 μm was formed. In this manner, a rear electrode of a two-layer structure including a first rear electrode of the calcium layer and a second rear electrode of the silver layer was formed.

Thereafter, a sealing layer was formed to cover an exposed surface of the transparent electrode, outer side surfaces of the electric insulation layer, side surfaces of the organic luminescence part, and an outer surface of the rear electrode, so that there was provided a luminescence display panel having the same structure as that of the luminescence display panel 30 shown in FIG. 3 except for an absence of the gas barrier layer 22 (see, FIG. 3). The luminescence display panel could display thereon a character line "ABC" in an upper half part and a character line "あいう" in a lower half part, such that each character emitted light.

The sealing layer was formed according to the following manner. A gas barrier layer of 0.1 μm in film-thickness made of silicon oxynitride was formed on one surface of a substrate of a polyether sulfone film of 300 μm in film-thickness. An adhesive layer of 150 μm in film-thickness made of acryl resin-based ultraviolet curing resin composition was formed on an inner peripheral part of a surface of the gas barrier layer. In a nitrogen gas atmosphere, the adhesive layer was laid on the gas barrier layer such that the adhesive layer faced inside. Thereafter, the adhesive layer was irradiated with a ultraviolet ray of a predetermined wavelength, so that the adhesive layer was cured and adhered to its base.

COMPARATIVE EXAMPLE 1

A luminescence display panel was manufactured under the same conditions as those of Example 1, except that the luminescence display panel in Comparative Example 1 had no auxiliary electrode.

<Evaluation>

By applying a direct current of 5V to the luminescence display panels of Example 1 and Comparative Example 1 in which the transparent electrode served as a cathode while the rear electrode served as an anode, luminous efficiencies of the luminescence display panels were compared to each other. A luminous efficiency of the luminescence display panel manufactured in Example 1 was 1.5 times to 3 times higher than a luminous efficiency of the luminescence display panel manufactured in Comparative Example 1.

When an image quality of the luminescence display panel manufactured in Example 1 was evaluated by visually observing the character line "ABC" and the character line "あいう" displayed on the panel, there was substantially no deterioration in visuality which might be caused by a reflection of external light, and thus the image quality was good.

The invention claimed is:

1. A luminescence display panel for displaying a predetermined pattern formed by a luminescence region and a non-luminescence region, comprising:
   a flexible transparent substrate;
   a transparent electrode formed on the transparent substrate, over the luminescence region and the non-luminescence region;
   an auxiliary electrode formed on the transparent electrode, over the non-luminescence region;
   an electrical insulation layer formed on the transparent electrode, over the non-luminescence region;
   an organic luminescence part formed on the transparent electrode, at least over the luminescence region; and
   a rear electrode formed on the organic luminescence part; wherein
   the auxiliary electrode is covered with the electrical insulation layer, and the electrical insulation layer is provided between the transparent electrode and the organic luminescence part and has a predetermined pattern corresponding to the non-luminescence region in which the transparent electrode and the organic luminescence part are locally insulated from each other in the area of the electrical insulation layer, and are connected to each other in the area other than the electrical insulation layer.

2. The luminescence display panel according to claim 1, wherein
   a gas barrier layer is interposed between the flexible transparent substrate and the transparent electrode.

3. The luminescence display panel according to claim 1, wherein
   a sealing layer is formed to cover an exposed surface of the rear electrode and an exposed surface of an organic luminescence part.

4. The luminescence display panel according to claim 1, wherein
   the predetermined pattern is formed of a plurality of pattern elements defining parts of the luminescence region, and
   the auxiliary electrode is disposed to surround a pattern line including some of the pattern elements.

5. The luminescence display panel according to claim 4, wherein
   the auxiliary electrode is further disposed between the pattern elements.

6. The luminescence display panel according to claim 1,
   the predetermined pattern is formed of a plurality of pattern elements defining parts of the non-luminescence region, and
   the auxiliary electrode is disposed to surround a pattern line including some of the pattern elements.

7. The luminescence display panel according to claim 6, wherein
   the auxiliary electrode defines an inner periphery of further parts of the non-luminescence region surrounding the pattern line.

8. The luminescence display panel according to claim 1, wherein
   the rear electrode has a first rear electrode having a higher chemical activity than a second rear electrode and the second rear electrode covers the first rear electrode.

9. The luminescence display panel according to claim 1, wherein
   the rear electrode is formed of a transparent electrode.

10. The luminescence display panel according to claim 3, wherein
    the sealing layer is of a layered body including a substrate layer, a gas barrier layer for sealing, and an adhesive layer, which are disposed in this order from outside.

* * * * *